United States Patent [19]

Diedrich et al.

[11] 4,312,115
[45] Jan. 26, 1982

[54] PROCESS TO OBTAIN MULTIELEMENT LINEAR BIDIMENSIONAL INFRARED DETECTORS HAVING IMPROVED EXACTNESS OF GEOMETRY AND HIGH DEGREE OF INTEGRATION

[76] Inventors: Heinz Diedrich, Via Lipari, 44, Rome, Italy, 00141; Marco Fazi, Via M. Fascetti, 26, Rome, Italy, 00136; Domenico Fanti, Via Leopardi, 51, Bagni Di Tivoli (Rome), Italy, 00011; Angelo Mercuri, Via S.M. Ausiliatrice, 67; Romolo Tranquilli, Via Eurialo, 14, both of Rome, Italy, 00181

[21] Appl. No.: 120,748

[22] Filed: Feb. 12, 1980

Related U.S. Application Data

[63] Continuation of Ser. No. 860,228, Dec. 13, 1977, abandoned.

[30] Foreign Application Priority Data

Dec. 14, 1976 [IT] Italy ............................ 52606 A/76

[51] Int. Cl.³ .......................................... H01L 31/18
[52] U.S. Cl. ..................................... 29/572; 29/580; 29/590
[58] Field of Search ................. 29/572, 583, 580, 589, 29/590

[56] References Cited

U.S. PATENT DOCUMENTS

| | | | |
|---|---|---|---|
| 3,152,939 | 10/1964 | Borneman et al. | 29/580 |
| 3,333,324 | 8/1967 | Roswell et al. | 29/580 |
| 3,427,709 | 2/1969 | Schutze et al. | 29/580 |
| 3,623,218 | 11/1971 | Mitarai et al. | 29/580 |
| 3,689,993 | 9/1972 | Tolar | 29/583 |
| 3,890,215 | 6/1975 | Dilorenzo et al. | 29/580 |
| 3,977,071 | 8/1976 | Jarman | 29/572 |
| 4,217,689 | 8/1980 | Jujii et al. | 29/583 |

*Primary Examiner*—Donald L. Walton
*Attorney, Agent, or Firm*—Holman & Stern

[57] ABSTRACT

An improved method for use in fabricating individual semiconductor radiation detectors on a chip is characterized by forming generally V-shaped grooves converging toward one another from opposite sides of the chip into the thickness dimension thereof. The grooves meet within the chip and serve to separate individual detectors.

7 Claims, 15 Drawing Figures

FIG. 1A
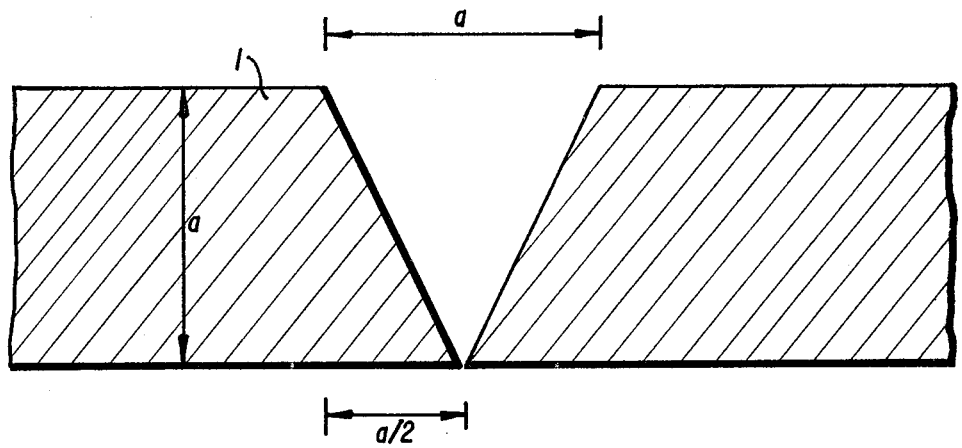
FIG. 1B
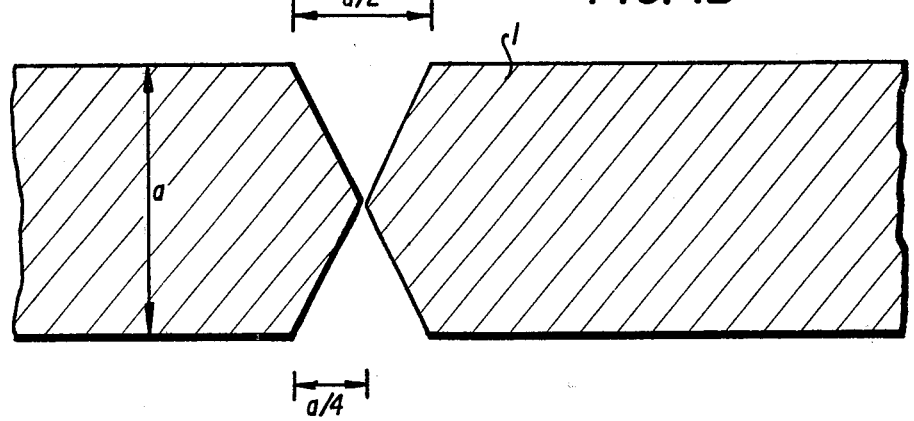
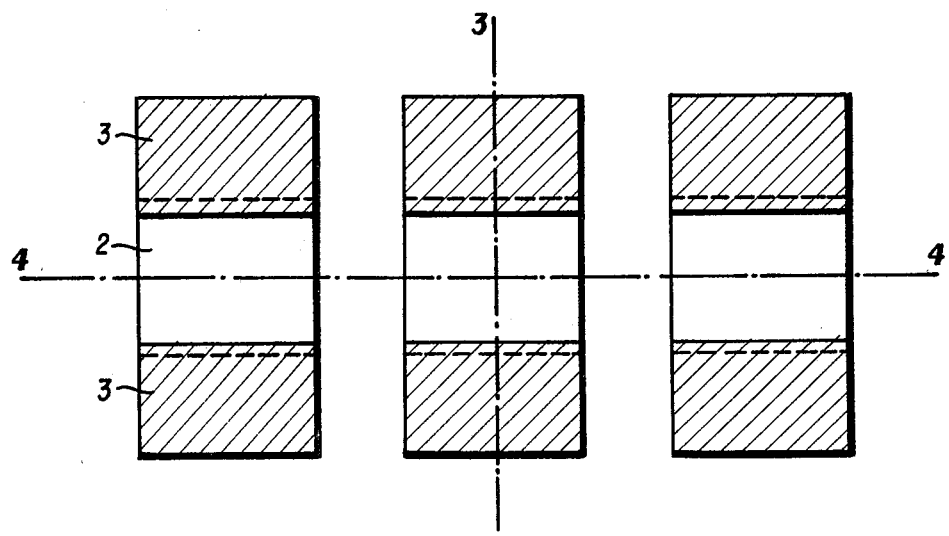
FIG. 2

PROCESS TO OBTAIN MULTIELEMENT LINEAR BIDIMENSIONAL INFRARED DETECTORS HAVING IMPROVED EXACTNESS OF GEOMETRY AND HIGH DEGREE OF INTEGRATION

This is a continuation of application Ser. No. 860,228, filed Dec. 13, 1977, now abandoned.

BACKGROUND OF THE INVENTION

The present invention refers to a process to obtain multielement linear bidimensional infrared detectors having improved exactness of geometry and high degree of integration.

More particularly the present invention refers to a process which permits to obtain multielement infrared detectors in which the distance between each element and the next is considerably reduced.

This process is specifically applied to obtain an infrared detector device utilizing a large number of active and passive elements disposed according to a geometry which is fixed and optimized according to the system in which the device will be utilized.

One of the problems most studied by the technicians who operate in the multielement IR detector field is, as it is well known, to reduce as much as possible the distance between each element and the next. It must be pointed out that the reduction of said distance in a detector, implies the reduction of the surface not utilized for detecting the infrared radiation or in other words the reduction of that amount of radiation which is not detected because is exactly focused between two consecutive elements. In the case of parallel-scanning of the scene, this feature is very much important.

The diameter of a scan measured between points having as intensity equal to half of the maximum obtainable by a f/1 optics, for a typical wave-length of 5 $\mu$m, is about 10 $\mu$m.

Thus, the distance between the elements in a IR detector should be at least of the same quantity range. In the prior art technologies the separation of the single detector from the others is obtained as follows. Starting from a semiconductor chip having the desired thickness, a groove is engraved or dug as deep as the thickness of the chip to permit the separation of the detectors.

There are many engraving methods like chemical etching, ionic erosion, etc.

Nevertheless they have all one common feature: the engraved walls are not completely perpendicular to the chip surface but are slightly oblique inwardly toward the groove. Optimistically, it can be assumed that the slope rate is about 0.5.

This means that if the chip has a thickness of 20 $\mu$m, each wall of the groove will reach inwardly about 10 $\mu$m. Then the smallest distance obtainable between the superior surfaces to be utilized of two consecutive elements cannot be less than 20 $\mu$m which is twice the desired optimum value.

On the other hand, it must be pointed out that technological reasons do not allow to use chips having a thickness less than 20 $\mu$m.

An attempt to overcome this difficulty has been made by utilizing the element by element assembling process.

This solution involves deterioration of alignment and planarity values of the elements and then of the entire surface offered to the radiation.

A further disadvantage of this assembling process is represented by the fact that it involves increased number of technical steps and then an increased cost and assembling time.

SUMMARY OF THE INVENTION

These inconveniences have been overcome by the process of the present invention which permits a reduction in the distance between two consecutive elements by processing both surfaces of the semiconductor chip.

Prior art processing techniques effectuate the deposition of the geometry, the electrolitic growing of metal contacts and generally all the technological procedures utilized to obtain IR detectors, on a single surface of the chip. As it will be described, the processing of both the surfaces will permits a reduction in the distance between two consecutive elements to half of the distance obtainable with prior art techniques.

To obtain the alignment of the geometry of the two surfaces, holes or slots, positioned and made on the same chip, will be utilized.

The alignment exactness results, in this case, about 1-2 $\mu$m. Therefore it is an object of the present invention to obtain IR detector devices in which the distance between each element and the next is considerably reduced.

It is another object of the present invention to obtain said reduction following a modular approach.

Moreover the process according to the present invention comprises the following advantages. Firstly the processing of both surfaces permits a maximization of the active surface due to the fact that one can bring the major portion of the contacts on the surface having the active elements not reached by the radiation.

Another advantage is represented by the fact that the present process permits all the processing steps to take place while the semiconductor chip has not yet been thinned to the typical size of photosensitive elements (max 20 $\mu$m).

This feature decreases substantially the failure probability of the same chips and minimizes the damages of the crystalline structure due to mechanical stress occurring during the processing, taking into account also the high degree of fragility of semiconductor chips usually employed.

The mentioned reduction of chip's failures in MSI or LSI devices, as the multielement IR detectors are, increases the efficiency of the process and consequently is an economic advantage as well.

This advantage is magnified in IR detector devices because of the high cost of initial materials and of the plurality of technological processes involved to in obtaining the final product.

BRIEF DESCRIPTION OF THE DRAWINGS

The present invention will now be described with reference to the attached drawings in which:

FIGS. 1a and 1b, show a cross section of a semiconductor chip, illustrating the walls of the grooves, respectively in the processing of a single surface and of both the surfaces;

FIG. 2 shows a schematic plan view of three detectors obtained according to the present invention;

DETAILED DESCRIPTION OF A PREFERRED EMBODIMENT

Referring now to FIG. 1a, it shows the semiconductor chip 1 having a thickness indicated with "a".

It can be noted, in the figure, that effectuating an engraving having a slope equal to 0.5, the bottom wall will project into the groove for a distance equal to a/2.

The distance between two consecutive detecting surfaces will be equal to "a" and so equal to the thickness of the chip. FIG. 1b shows that, by starting the engraving from the superior surface and ending at half the thickness of the chip, with the same slope, the inwardly projection of the wall will be equal to a/4.

Engraving a second groove on the inferior surface will result in the distance between two consecutive detecting superior surfaces being equal to A/2.

The technological process to obtain a prespecified detector mosaic according to the present invention will be now described in more detailed manner.

It must be stressed that the novelty characteristic of the process stands, as previously said, in the fact that the engraving to separate two consecutive elements is effectuated in two consecutive steps processing both the surfaces of the semiconductor chips.

Thus the present disclosure does not enter in the specific details of technological processing because the single steps are to be considered known to those skilled in the art, being the novelty feature represented by the whole process in itself and particularly that both the surfaces of the semiconductor chip are processed.

The process described in the next must be considered within said spirit and it is only illustrative and not limitating to any respect.

FIG. 2 shows schematically three consecutive detectors 2, which can pertain either to a linear chain or to a mosaic pattern.

Each one of detector 2 has a pair of contacts 3. FIG. 3 shows the sequence of processing steps which permits to obtain the structure shown in FIG. 2, viewed through the cross-section taken along line 3—3, and FIG. 4 shows the same sequence viewed through the cross-section taken along line 4—4. It must be pointed out that the attached drawings are only by way of example and are not to the exact proportionality and scale.

Figure 3A:
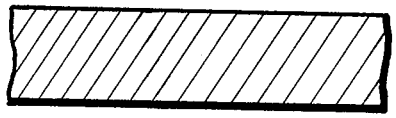
FIGS. 3 and 4 show in sequence, the operating steps, schematically, according to the process to obtain detectors of FIG. 2, viewed through cross-sections taken along lines 3—3 and 4—4 respectively.
Figure 4A:
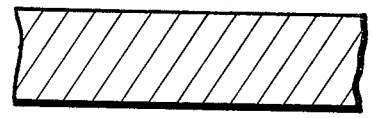

FIGS. 3a and 4a show the chip of photosensitive semiconductor material before processing.

Figure 3B:
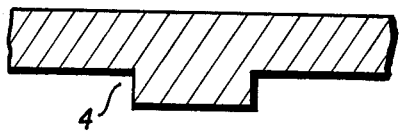
Figure 4B:
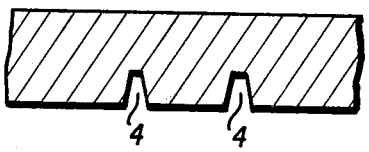

Semiconductor materials commonly employed are Indium Antimonide, Cadmium and Mercury Telluride, Lead and Tin Telluride. FIGS. 3b and 4b show the chip which has been engraved to delineate the elements through a first sequence of grooves 4. Grooves are preferably obtained through ionic erosion.

Simultaneously several holes or slot (not shown) are effectuated, which project deeper in the chip and are utilized as reference points to obtain the alignment of the geometry on the other face of the semiconductor or chip.

Figure 3C:
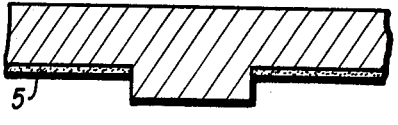

FIG. 3c shows the growing of contact metal elements 5, obtained through conventional manner.

Figure 4D:
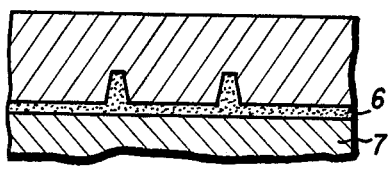
Figure 3D:
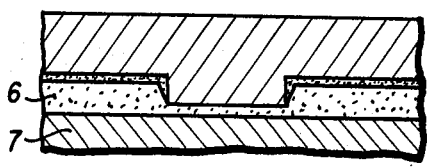
Figure 3E:
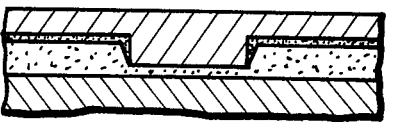

At this point, on the inferior side of the chip is glued by 6 a suitable support base 7 (FIGS. 3d and 4d).

Thus, through conventional methods, the chip is thinned to the desired thickness. Such a thickness is typically about 20 μm.

At the end of this thinning step, alignment holes will become visible and therefore the delineation of geometry of detectors can be carried out on the face that will constitute the photosensitive surface.

Figure 4E:
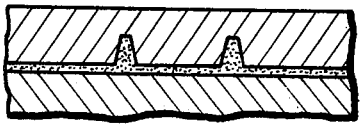
Figure 4F:
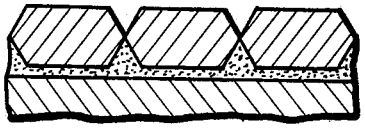
Figure 3F:
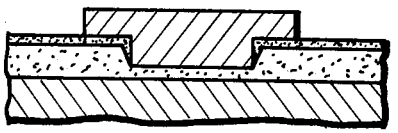

FIGS. 3f and 4f show said step, obtained through chemical erosion and masking by photoresist.

As it has already been described, the alignment is obtained taking advantage of reference holes become visible on the superior surface.

Each of the photosensitive element is separated from the other and the separation distance is half of that obtainable processing a single surface.

Figure 3G:
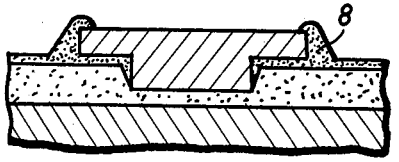

FIG. 3g finally shows the carrying out of ohmic contacts 8 which constitutes the final step of the technological cycle described.

Therefore it is specific object of the present invention to provide a process to obtain multielement infrared detectors characterized by the following steps:

a first delineation of the geometry of detector elements through engraving a face of photosensitive semiconductor chip;

carrying out the metal contacts at two sides of each of said detector;

glueing of said semiconductor chip, by the side of the engraved face, on a base support;

thinning the chip to the desired thickness;

a second delineation of the geometry of detector elements on the thinned face through a second engraving so as to obtain the separation of the detector elements;

carrying out the placement of ohmic contacts.

It must be stressed that during the first delineation step some holes or slots, having a thickness equal to that of the final chip, are provided. These holes, during the thinning step, becoming visible on the thinned surface, and provide a reference to obtain an exact alignment with the second delineation of the geometry of detector elements.

The present invention has been described with reference to a specific technological method but it must be considered that the inventive principle can be applied to cycles which differ because of the succession of the steps or of the different process involved, without going out of the ambit of protection of the present invention.

What is claimed is:

1. An improved method for use in fabricating individual semiconductor radiation detectors on a chip having first and second major opposed surfaces defining a chip thickness dimension therebetween, said method relating to minimizing the separation between adjacent detectors to optimize the utilization of available space on the chip, said method comprising the steps of:

removing material from the chip from said first surface inward relative to said thickness dimension to define first grooves along prescribed lines, said grooves having sloping sides;

removing further material from the chip from said second surface inward relative to said thickness dimension to define second grooves generally aligned with and contacting said first grooves, said first grooves each being disposed symmetrically with respect to a respective second groove about an imaginary plane extending through said chip parallel to said first and second surfaces.

2. The method of claim 1 wherein said radiation detectors are IR detectors and after said first removing step and before said second removing step, said method includes the steps of:

placing contacts on said one of said surfaces;

bonding said one of said surfaces to a base support; and reducing the thickness of said detectors such that said grooves have a depth equal to one half the remaining thickness of said detector.

3. The method of claim 2 wherein after said secondly removing step, said method includes the step of placing ohmic contacts between said metal contacts and said detector.

4. The method of claim 3 wherein said first removing step includes providing alignment holes in said detector by removing material in selected locations to a depth equal to the remaining thickness of said detector.

5. The method of claim 4 wherein said first removing step comprises engraving by ionic erosion.

6. The method of claim 5 wherein said secondly removing step comprises chemical photoetching.

7. An improved method for use in fabricating individual semiconductor radiation detectors on a chip having first and second major opposed surfaces defining a chip thickness dimension therebetween, said method relating to minimizing the separation between adjacent detectors to optimize the utilization of available space on the chip, said method comprising the steps of:

removing material from the chip from said first surface inward to said thickness dimension to define first grooves along prescribed lines;

removing further material from the chip from said second surface inward to said depth dimension to define second grooves generally aligned with and contacting said first grooves, said first and second grooves having cross-sections which converge inwardly to said thickness dimension from said first and second surfaces and toward a location where said second grooves contact said first grooves.

* * * * *